(12) United States Patent
Vaartstra

(10) Patent No.: US 7,943,501 B2
(45) Date of Patent: May 17, 2011

(54) SYSTEMS AND METHODS OF FORMING TANTALUM SILICIDE LAYERS

(75) Inventor: Brian A. Vaartstra, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/969,182

(22) Filed: Jan. 3, 2008

(65) Prior Publication Data

US 2008/0102629 A1    May 1, 2008

Related U.S. Application Data

(60) Continuation of application No. 11/217,507, filed on Sep. 1, 2005, now abandoned, which is a division of application No. 10/229,813, filed on Aug. 28, 2002, now Pat. No. 6,995,081.

(51) Int. Cl.
*H01L 21/3205* (2006.01)
*H01L 21/4763* (2006.01)

(52) U.S. Cl. ........ 438/592; 438/653; 438/654; 438/655; 438/656; 438/657; 257/165; 257/2

(58) Field of Classification Search .................... 438/592
See application file for complete search history.

(56) References Cited

U.S. PATENT DOCUMENTS

| | | |
|---|---|---|
| 4,608,271 A | 8/1986 | Hieber et al. |
| 4,766,006 A | 8/1988 | Gaczi |
| 5,087,593 A | 2/1992 | Narula |
| 5,256,244 A | 10/1993 | Ackerman |
| 5,350,719 A | 9/1994 | Narula et al. |
| 5,453,527 A | 9/1995 | Baldus et al. |
| 5,576,579 A | 11/1996 | Agnello et al. |
| 5,742,322 A | 4/1998 | Cranton et al. |
| 5,849,071 A | 12/1998 | Derbenwick et al. |
| 5,908,947 A | 6/1999 | Vaartstra |
| 5,916,634 A | 6/1999 | Fleming et al. |
| 5,919,522 A | 7/1999 | Baum et al. |
| 5,981,331 A | 11/1999 | Tsunemine |
| 5,997,949 A | 12/1999 | Nicolet et al. |
| 6,015,917 A | 1/2000 | Bhandari et al. |
| 6,117,692 A | 9/2000 | Kim et al. |
| 6,143,081 A | 11/2000 | Shinriki et al. |
| 6,153,519 A | 11/2000 | Jain et al. |
| 6,174,809 B1 * | 1/2001 | Kang et al. ................. 438/682 |
| 6,200,893 B1 * | 3/2001 | Sneh ........................ 438/685 |
| 6,203,613 B1 | 3/2001 | Gates et al. |

(Continued)

FOREIGN PATENT DOCUMENTS

EP    0 442 704 A2    8/1991

(Continued)

OTHER PUBLICATIONS

U.S. Appl. No. 11/943,688, filed Nov. 21, 2007, Vaartstra.

(Continued)

*Primary Examiner* — Charles D Garber
*Assistant Examiner* — Pape Sene
(74) *Attorney, Agent, or Firm* — Wells St. John P.S.

(57) ABSTRACT

A method of forming (and apparatus for forming) tantalum silicide layers (including tantalum silicon nitride layers), which are typically useful as diffusion barrier layers, on a substrate by using a vapor deposition process with a tantalum halide precursor compound, a silicon precursor compound, and an optional nitrogen precursor compound.

14 Claims, 2 Drawing Sheets

U.S. PATENT DOCUMENTS

| | | | |
|---|---|---|---|
| 6,271,094 B1 | 8/2001 | Boyd et al. | |
| 6,273,951 B1 | 8/2001 | Vaartstra | |
| 6,277,436 B1 | 8/2001 | Stauf et al. | |
| 6,287,965 B1 | 9/2001 | Kang et al. | |
| 6,335,049 B1 | 1/2002 | Basceri | |
| 6,342,445 B1 | 1/2002 | Marsh | |
| 6,348,412 B1 | 2/2002 | Vaartstra | |
| 6,351,036 B1 | 2/2002 | Stumborg et al. | |
| 6,387,764 B1 | 5/2002 | Curtis et al. | |
| 6,391,785 B1 | 5/2002 | Satta et al. | |
| 6,461,982 B2 | 10/2002 | DeBoer et al. | |
| 6,479,364 B2 | 11/2002 | Shin et al. | |
| 6,511,539 B1 | 1/2003 | Raaijmakers | |
| 6,527,855 B2 | 3/2003 | DelaRosa et al. | |
| 6,534,395 B2 | 3/2003 | Werkhoven et al. | |
| 6,585,823 B1 | 7/2003 | Van Wijck | |
| 6,586,330 B1 | 7/2003 | Ludviksson et al. | |
| 6,590,251 B2 | 7/2003 | Kang et al. | |
| 6,683,381 B2 | 1/2004 | Harada | |
| 6,703,708 B2 | 3/2004 | Werkhoven et al. | |
| 6,706,115 B2 | 3/2004 | Leskelä et al. | |
| 6,730,164 B2 | 5/2004 | Vaartstra et al. | |
| 6,794,284 B2 | 9/2004 | Vaartstra | |
| 6,846,516 B2 | 1/2005 | Yang et al. | |
| 6,884,466 B2 | 4/2005 | Kaloyeros et al. | |
| 6,967,159 B2 | 11/2005 | Vaartstra | |
| 6,995,081 B2 | 2/2006 | Vaartstra | |
| 7,122,464 B2 | 10/2006 | Vaartstra | |
| 7,196,007 B2 | 3/2007 | Vaartstra | |
| 7,300,870 B2 | 11/2007 | Vaartstra | |
| 2002/0086111 A1 | 7/2002 | Byun et al. | |
| 2003/0186515 A1* | 10/2003 | Dean et al. | 438/478 |
| 2003/0188682 A1 | 10/2003 | Tois et al. | |
| 2003/0190423 A1* | 10/2003 | Yang et al. | 427/255.28 |
| 2003/0211736 A1* | 11/2003 | Ludviksson et al. | 438/683 |
| 2004/0096582 A1 | 5/2004 | Wang et al. | |
| 2006/0048711 A1 | 3/2006 | Vaartstra | |
| 2006/0292788 A1 | 12/2006 | Vaartstra | |
| 2007/0144438 A1 | 6/2007 | Vaartstra | |
| 2007/0166999 A1 | 7/2007 | Vaartstra | |

FOREIGN PATENT DOCUMENTS

| | | |
|---|---|---|
| EP | 1 205 574 A2 | 5/2002 |
| JP | 63109172 | 5/1988 |
| JP | 03-183776 | 8/1991 |
| WO | WO 01/40541 | 6/2001 |

OTHER PUBLICATIONS

Alén et al., "*Tert*-butylamine and allylamine as reductive nitrogen sources in atomic layer deposition of TaN thin films," *J. Mater. Res.*, Jan. 2002; 17(1):107-13.

Aselage, "Preparation and Properties of Icosahedral Borides," *The Physics and Chemistry of Carbides; Nitrides and Borides*, R. Freer, ed., 1990, 185:97-111.

Atomic Layer Deposition (ALD 2002) Conference, Aug. 19-21, 2002, at Hanyang University in Seoul, Korea, Conference Schedule [online] [retrieved Jul. 8, 2003]. Retrieved from the Internet:<URL:http://www.avs.org/conferences/ald/2002/program/aug19.html>; 3 pgs.

Atomic Layer Deposition (ALD 2002) Conference, Aug. 19-21, 2002, at Hanyang University in Seoul, Korea, Oral and slide Presentations [CD-ROM]. Available online from the Internet:<URL:https://www.avs.org/conferences/ald/2002cd_form.html: 2 CDs.

Bachmann et al., "Characterization and Properties of Artificially Grown Diamond," *Diamond and Diamond-Like Films and Coatings*, R.E. Clausing et al., eds., 1991; 266:677-713.

Badzian et al., "Graphite-Boron Nitride Solid Solutions by Chemical Vapor Desposition," *Proceedings of the 3rd International Conference on Chemical Vapor Deposition*, F.A. Glaski, ed.1972; 747-53.

Bouteville et al., "LPCVD of Ta and Ti disilicides. TaCl$_5$ solid source—selectivity of TiSi$_2$, growth," *Proc. Eur. Conf. Chem. Vap. Deposition*, R. Porat, ed., Jerusalem, Israel, 1987, Mar. 29-Apr. 3; 6:264-9.

Chen et al., "Electrical Properties of the System: Boron-Nitrogen-Carbon," *Proceedings of the 3rd International Carbon Conference*, 1980; 44-7.

Chen et al., "Low-temperature chemical vapor deposition of tantalum nitride from tantalum pentabromide for integrated circuitry copper metallization applications," *J. Mater. Res.*, May 1999; 14(5): 2043-52.

Chen et al., "Low temperature plasma-assisted chemical vapor deposition of tantalum nitride from tantalum pentabromide for copper metallization," *J. Vac. Sci. Technol. B*, Jan./Feb. 1999; 17(1):182-5.

Cho et al., "Diffusion Barrier Properties of Metalorganic Chemical Vapor Deposited Tantalum Nitride Films Against Cu Metallization," *J. Electrochem. Soc.*, Oct. 1999; 146(10):3724-30.

Conde et al., "Influence of carbon content on the crystallographic structure of boron carbide films," *Surface and Coatings Technology*, Mar. 2000; 125(1-3):141-6. Published online Feb. 28, 2000.

Conde et al., "Boron carbide thin films prepared by Co$_2$, laser assisted chemical vapour deposition," *Protective Coatings and Thin Films: Synthesis, Characterization and Applications, ASI Series*, Y. Pauleau et al., eds., Dordrecht, The Netherlands, May 30-Jun. 5, 1996; title page, publication page, table of contents, 21:99-109.

Cullity, *Elements of X-Ray Diffraction, 2nd Edition*, 1978; cover page, publication page, table of contents only; 6 pgs.

Dekempeneer et al., "Tribological and structural properties of amorphous B-N-C coatings," *Surface and Coatings Technology*, Dec. 15, 1996; 86-87:581-5.

Dinescu et al., "Boron carbon nitride films deposited by sequential pulses laser deposition," *Applied Surface Science*, May 1998; 127-129:692-6.

Dubovik et al., "High Temperature Boron Carbonitride Based Ceramics," *Journal of the Less-Common Metals*, Mar. 1986; 117(1-2):265-9.

Emin, "Icosahedral boron-rich solids," *Physics Today*, Jan. 1987, 40(1):55-62.

Gordon et al., "Vapor deposition of metal oxides and silicates: possible gate insulators for future microelectronics," *Chem. Mater.*, 2001, 13(8):2463-4. Published online Jul. 10, 2001.

Hara et al., "Barrier Properties for Oxygen Diffusion in a TaSiN Layer," *Jpn. J. Appl.-Phys.*, Jul. 15, 1997; 36(7B), L893-L895.

Hawley, *The Condensed Chemical Dictionary*, 10th Edition, Van Nostrand Reinhold Co., New York, 1981; 225-226.

Hendrix et al., "Composition control of Hf$_{1-x}$Si$_x$O$_2$ films deposited on Si by chemical-vapor deposition using amide precursors," *Appl. Phys. Lett.*, Apr. 1, 2002; 80(13):2362-4.

Hieber et al., "Possible Applications of Tantalum Silicide for Very-Large-Scale Integration Techology," *Thin Solid Films*, Jun. 16, 1986; 140(1):131-5.

X-ray Photoelectron Spectroscopy (XPS) Database, Version 3.2 (Web Version), [online]. [retrieved Nov. 26, 2008]. Retrieved from the Internet: <http://srdata.nist.gov/xps/>. 1 page.

Nist WebBook, [online]. [retrieved Dec. 12, 2002]. Retrieved from the Internet: <http://webbook.nist.gov/>. 2 pages.

Juppo, "Atomic Layer Deposition of Metal and Transition Metal Nitride Thin Films and In Situ Mass Spectrometry Studies," Dissertation, Dec. 14, 2001, University of Helsinki, Department of Chemistry, Helsinki, Finland; 1-65.

Kaner et al., "Boron-Carbon-Nitrogen Materials of Graphite-Like Structure," *Materials Research Bulletin*, Mar. 1987; 22(3):399-404.

Kawaguchi, "B/C/N. Materials Based on the Graphite Network," *Advanced Materials*, 1997; 9(8):615-25.

Knotek et al., "Mechanical and Tribological Properties of Thin Films Produced by Sputtering Within the B-N-C Triangle," *Hard Coatings Based on Borides, Carbides and Nitrides*, A. Kumar et al., eds., Warrendale, Pennsylvania, title page, table of contents, 1998; 169-78.

Kolawa et al., "Tantalum-based diffusion barriers in Si/Cu VLSI metallizations," *J. Appl. Phys.*, Aug. 1991; 70(3):1369-73.

Lee et al., "Structural and chemical stability of Ta-Si-N thin film between Si and Cu," *Thin Solid Films*, May 4, 1998; 320(1):141-6.

Lee et al., "High-k gate dielectric applications using ALD Hf-based oxides," *Solid State Technology*, Jan. 2003; 46(1):45-6, 56.

Liu et al., "Atomic Layer Deposition of Hafnium Oxide Thin Films from Tetrakis(dimethylamino)Hafnium (TDMAH) and Ozone," *Mat Res Soc Symp Proc*, 2003; 765:97-102.

Maruyama et al., "Silicon dioxide thin films prepared by chemical vapor deposition from tetrakis (dimethylamino) silane and ozone," *Appl. Phys. Lett.*, Aug. 2, 1993; 63(5):611-13.

"The Merck Index, An Encyclopedia of Chemicals and Drugs," $9^{th}$ Edition, 1976, Merck & Co., Rahway, NJ, USA, pp. 449, 1098-1099.

Moore et al., "Properties and characterization of codeposited boron nitride and carbon materials," *Journal of Applied Physics*, Jun. 15, 1989; 65(12):5109-118.

Newport et al., "The dual source APCVD of titanium nitride thin films from reaction of hexamethyldisilazane and titanium tetrachloride," *J. Mater. Chem.*, 2002; 12(6):1906-9. Published online Apr. 29, 2002.

Ohshita et al., "$HfO_2$ growth by low-pressure chemical vapor deposition using the $Hf(N(C_2H_5)_2)_4/O_2$ gas system," *Journal of Crystal Growth*, Nov. 2001; 233(1):292-7.

Ohshita et al., "Using tetrakis-diethylamido-hafnium for $HfO_2$ thin-film growth in low-pressure chemical vapor deposition," *Thin Solid Films*, Mar. 1, 2002; 406(1-2):215-18.

Oliveira et al., "Deposition of boron carbide by laser CVD: a comparison with thermodynamic predictions," *Solid Thin Films*, Oct. 10, 1997; 307(1-2):29-37.

Oliveira et al., "Synthesis and properties of $B_xC_{11}N_z$ coatings," *J. Mater. Res.*, Mar. 2001; 16(3):743-43.

Oliveira et al., "XPS investigation of $B_xC_{11}N_z$ coatings deposited by laser assisted chemical vapour desposition," *Surface & Coatings Technology*, Mar. 1998, 100-101:398-403.

Redlich et al., "B-C-N nanotubes and boron doping of carbon nanotubes," *Chemical Physics Letters*, Sep. 27, 1996; 260(3-4):465-70.

"Refractory metal," *Webster's New Universal Unabridged Dictionary*, Avenel, New Jersey, 1992; p. 1207.

Reynolds, "Low pressure chemical vapor deposition of tantalum silicide," Presentation Abstract, *Proc. Electrochem. Soc.*, Palo Alto, CA, USA, 1987.

Reynolds, "Low pressure chemical vapor deposition of tantalum silicide," *J. Electrochem. Soc.*, Jun. 1998; 135(6):1483-90.

Ritala et al., "Atomic layer deposition of oxide thin films with metal alkoxides as oxygen sources," *Science*, Apr. 14, 2000; 288:319-21.

Saugnac et al., "Characterization of C-B-N Solid Solutions Deposited from a Gaseous Phase between 900° and 1050°C," *Journal of the American Ceramic Society*, Jan. 1992; 75(1):161-9.

Shimanouchi, *Tables of Molecular Vibrational Frequencies Consolidated* vol. I; Tokyo, Japan, 1972; title page, foreward, table of contents, p. 1, abstract; 6 pages total.

Suzuki et al., "Atomic Layer Deposition of $HfO_2$ using $Hf(N(C_2H_5)_2)_4$ and $O_3$," Poster Presentation, *ALD 2002 Conference*, Hanyang University, Seoul, Aug. 14, 2002; 14 pages.

Szörényi et al., "Chemical analysis of a-$CN_x$ thin films synthesized by nanosecond and femtosecond pulsed laser deposition," *Applied Physics A*, 1999; 69[Suppl]:S941-S944. Published online Dec. 28, 1999.

Tallant et al., "Boron carbide structure by Raman spectroscopy," *Physical Review B*, Sep. 15, 1989; 40(8):5649-56.

Telle, "Chapter 4—Boride and Carbide Ceramics," *Materials Science and Technology, vol. 11: Structure and Properties of Ceramics*, M. Swain, ed., New York, New York, 1994; cover page, title page, publication page, table of contents; 11:173-266.

Tsai et al, "Metalorganic chemical vapor deposition of tantalum nitride by terbutylimidotris (diethyalmido) tantalum for advanced metallization," *Appl. Phys. Lett.*, Aug. 21, 1995; 67(8):1128-30.

Ulrich et al., "Phase separation in magnetron sputtered superhard BCN thin films," *Diamond and Related Materials*, Jun. 1998; 7(6):839-44.

Vaartstra et al., Syntheses and Structures of a Series of Very Low Coordinate Barium Compounds: $Ba[N(SiMe_3)_2]_2(THF)_2$, $\{Ba[N(SiMe_3)_2]_2(THF)\}_2$, and $\{Ba[N(SiMe_3)_2]_2\}_2$, *Inorg. Chem.*, Jan. 9, 1991; 30:121-5.

Vehkamäki et al., "Growth of $SrTiO_3$ and $BaTiO_3$ Thin Films by Atomic Layer Deposition," *Electrochemical and Solid-State Letters*, Oct. 1999; 2(10):504-6.

Wallace et al., "Identifying the Most Promising High-k Gate Dielectrics," *Semiconductor International*, Jul. 2001; pp. 227-228, 230, 232, 234, 236.

Warren, *X-Ray Diffraction*, Mineola, New York, 1990, cover page, publication page, table of contents, 5 pages total.

Weber et al., "Growth of cubic boron nitride and boron-carbon-nitrogen coatings using N-trimethylborazine in an electron cyclotron resonance plasma process," *Diamond and Related Materials*, Mar. 31, 1993; 2(2-4):201-6.

Weiller et al., "Effect of Dimethylamine on the Chemical Vapor Deposition of TiN from Tetrakis(dimethylamido)titanium and Ammonia," *J. Electrochem. Soc.*, Mar. 1997; 144(3): L40-L43.

Widmer et al., "The growth and physical properties of low pressure chemically vapour-deposited films of tantalum silicide on $n^+$-type polycrystalline silicon," *Thin Solid Films*, Apr. 1, 1986; 138(1):131-40.

Williams et al., "Low pressure chemical vapor deposition of tantalum silicide," *J. Electrochem. Soc.*, Dec. 1986; 133(12):2637-44.

Winter et al., "A Single-Source Precursor to titanium Nitride Thin Films. Evidence for the Intermedicacy of Imido Complexes in the Chemical Vapor Deposition Process," *J. Am. Chem. Soc.*, Jan. 29, 1992; 114(3):1095-97.

Winter, "The Chemical Vapor Deposition of Metal Nitride Films Using Modern Metalorganic Precursors," *Aldrichimica Acta*, 2000; 33(1):3-12.

Ya Kosolapova et al., *Poroshkovaia Metallurgiia*, 1971; 1(97):27-33. (English Language Summary).

* cited by examiner

SYSTEMS AND METHODS OF FORMING TANTALUM SILICIDE LAYERS

This is a continuation of application Ser. No. 11/217,507, filed Sep. 1, 2005, (pending), which is a divisional of application Ser. No. 10/229,813, filed Aug. 28, 2002, (issued as U.S. Pat. No. 6,995,081), which are all incorporated herein by reference.

FIELD OF THE INVENTION

This invention relates to methods of forming tantalum layers containing silicon (silicide layers) and optionally nitrogen (silicon-nitride layers) on substrates using a vapor deposition process. The formed tantalum-containing layers are particularly useful as diffusion barriers for polysilicon substrates to reduce diffusion of oxygen, copper, or silicon.

BACKGROUND OF THE INVENTION

In very-large-scale integration (VLSI) technology, tantalum silicide has been proposed to be useful in a variety of applications. These include: policide gate metallization (i.e., the use of tantalum silicide in combination with a doped polycrystalline silicon (poly-Si) underlayer as a low resistive gate metallization layer); silicide gate (i.e., the use of tantalum silicide as a directly deposited layer on a gate oxide to reduce sheet resistance); source-drain silicidation (i.e., the use of tantalum silicide in the silicidation of contacts thereby providing in low resistive contacts); and diffusion barrier (i.e., the use of tantalum silicide a diffusion barrier between an Al—Si—Ti layer and silicon thereby providing reliable and low resistive contacts to n+ and p+ Si). Tantalum silicon nitride (Ta—Si—N) has also been shown to form a useful conductive barrier layer between silicon substrates and copper interconnects to reduce copper diffusion.

Lee et al., "Structural and chemical stability of Ta—Si—N thin film between Si and Cu," Thin Solid Films, 320:141-146 (1998) describe amorphous, ultra-thin (i.e., less than 100 Å) tantalum-silicon-nitrogen barrier films between silicon and copper interconnection materials used in integrated circuits. These barrier films suppress the diffusion of copper into silicon, thus improving device reliability. Barrier films having compositions ranging from $Ta_{0.43}Si_{0.04}N_{0.53}$ to $Ta_{0.60}Si_{0.11}N_{0.29}$ were deposited on silicon by reactive sputtering from Ta and Si targets in an $Ar/N_2$ discharge, followed by sputter-depositing copper films.

Methods for using physical vapor deposition (PVD) methods, such as reactive sputtering, to form Ta—Si—N barrier layers are known. Hara et al., "Barrier Properties for Oxygen Diffusion in a TaSiN Layer," Jpn J. Appl.-Phys., 36(7B), L893 (1997) describe noncrystalline, low resistivity Ta—Si—N layers that acts as a barrier to oxygen diffusion during high temperature annealing at 650° C. in the presence of $O_2$. The Ta—Si—N layers are formed by using radio-frequency reactive sputtering with pure Ta and Si targets on a 100 nm thick polysilicon layer. Layers having relatively low silicon content, such as $Ta_{0.50}Si_{0.16}N_{0.34}$, are stated to have a desirable combination of good diffusion barrier resistance along with low sheet resistance. These Ta—Si—N barrier layers have improved peel resistance over Ta—N barrier layers during annealing conditions.

However, when PVD methods are used, the stoichiometric composition of the formed metal silicon nitride barrier layers such as Ta—Si—N can be non-uniform across the substrate surface due to different sputter yields of Ta, Si, and N. Due to the resulting poor layer conformality, defects such as pinholes often occur in such layers creating pathways to diffusion. As a result, the effectiveness of a physically deposited diffusion barrier layer is dependent on the layer being sufficiently thick.

Vapor deposition processes such as chemical vapor deposition (CVD) and atomic layer deposition (ALD) processes are preferable to PVD processes in order to achieve the most efficient and uniform barrier layer coverage of substrate surfaces. There remains a need for a vapor deposition process to form tantalum silicides and tantalum silicon nitride barrier layers on substrates, such as semiconductor substrates or substrate assemblies.

SUMMARY OF THE INVENTION

This invention is directed to methods of using vapor deposition processes to deposit tantalum silicide layers (including tantalum silicon nitride layers) on substrates. The process involves combining one or more tantalum halide precursor compounds (preferably, $TaF_5$), one or more silicon precursor compounds, and optionally one or more nitrogen sources such as ammonia (as nitrogen precursor compound(s)).

In one embodiment, the present invention provides a method of forming a layer on a substrate (preferably, in a process of manufacturing a semiconductor structure). The method includes: providing a substrate (preferably a semiconductor substrate or substrate assembly such as a silicon wafer); providing a vapor that includes one or more tantalum precursor compounds of the formula $TaY_5$ (Formula I), wherein each Y is independently a halogen atom (preferably, F, Cl, I, or combinations thereof, and more preferably, F); providing a vapor that includes one or more silicon precursor compounds; and directing the vapors that include the one or more tantalum precursor compounds and the one or more silicon precursor compound to the substrate to form a tantalum silicide layer on one or more surfaces of the substrate. The resultant silicide layer (or silicon nitride layer) is typically suitable for use as a diffusion barrier layer, which is particularly advantageous when the substrate includes a silicon-containing surface.

The present invention also provides a method of manufacturing a memory device. The method includes: providing a substrate (preferably a semiconductor substrate or substrate assembly) that includes a silicon-containing surface; providing a vapor that includes one or more tantalum precursor compounds of the formula $TaY_5$ (Formula I), wherein each Y is independently a halogen atom; directing the vapor that includes the one or more precursor compounds of the Formula I to the substrate and allowing the one or more compounds to chemisorb on the silicon-containing surface; providing a vapor that includes one or more silicon precursor compounds; directing the vapor that includes the one or more silicon precursor compounds to the substrate with the chemisorbed compounds thereon to form a tantalum silicide barrier layer on the silicon-containing surface; providing a first electrode on the barrier layer; providing a high dielectric material over at least a portion of the first electrode; and providing a second electrode over the high dielectric material.

Preferred methods of the present invention also include steps of providing a vapor that includes one or more nitrogen precursor compounds and directing the vaporized nitrogen precursor compounds to the substrate to form a tantalum silicon nitride layer. Optionally, in certain embodiments, the methods can provide a vapor that includes one or more metal-containing precursor compounds of a different formula from Formula I and direct this vapor to the substrate.

The present invention also provides a vapor deposition apparatus that includes: a vapor deposition chamber having a substrate positioned therein; and one or more vessels that include one or more tantalum precursor compounds of the formula TaY$_n$ (Formula I), wherein each Y is independently a halogen atom; and one or more vessels that include one or more silicon precursor compounds. Optionally, the apparatus can include one or more vessels with one or more nitrogen precursor compounds therein.

The methods of the present invention can utilize a chemical vapor deposition (CVD) process, which can be pulsed, or an atomic layer deposition (ALD) process (a self-limiting vapor deposition process that includes a plurality of deposition cycles, typically with purging between the cycles). Preferably, the methods of the present invention use ALD. In one embodiment of an ALD process, the tantalum silicide layer is formed by alternately introducing the one or more vaporized precursor compounds and one or more vaporized silicon precursor compounds into a deposition chamber during each deposition cycle.

"Substrate" as used herein refers to any base material or construction upon which a metal-containing layer can be deposited. The term "substrate" is meant to include semiconductor substrates and also include non-semiconductor substrates such as films, molded articles, fibers, wires, glass, ceramics, machined metal parts, etc.

"Semiconductor substrate" or "substrate assembly" as used herein refers to a semiconductor substrate such as a metal electrode, base semiconductor layer or a semiconductor substrate having one or more layers, structures, or regions formed thereon. A base semiconductor layer is typically the lowest layer of silicon material on a wafer or a silicon layer deposited on another material, such as silicon on sapphire. When reference is made to a substrate assembly, various process steps may have been previously used to form or define regions, junctions, various structures or features, and openings such as capacitor plates or barriers for capacitors.

"Layer" as used herein refers to any metal-containing layer that can be formed on a substrate from the precursor compounds of this invention using a vapor deposition process. The term "layer" is meant to include layers specific to the semiconductor industry, such as "barrier layer," "dielectric layer," and "conductive layer." (The term "layer" is synonymous with the term "film" frequently used in the semiconductor industry.) The term "layer" is also meant to include layers found in technology outside of semiconductor technology, such as coatings on glass.

"Barrier layer" as used herein refers to a conductive, interfacial layer that can reduce diffusion of ambient oxygen through a dielectric layer into a semiconductor substrate (typically a polysilicon substrate) or can reduce diffusion of one layer into another, such as a copper conductive layer into a semiconductor substrate (typically a polysilicon substrate). For this invention, the barrier layer is a tantalum silicide or tantalum silicon nitride layer.

"Precursor compound" as used herein refers to tantalum precursor compounds, nitrogen precursor compounds, silicon precursor compounds, and other metal-containing precursor compounds, for example. A suitable precursor compound is one that is capable of forming, either alone or with other precursor compounds, a tantalum-containing layer on a substrate using a vapor deposition process. The resulting tantalum-containing layers also typically include silicon and optionally nitrogen. Such layers are often useful as diffusion barrier layers (i.e., barrier layers).

"Deposition process" and "vapor deposition process" as used herein refer to a process in which a metal-containing layer is formed on one or more surfaces of a substrate (e.g., a doped polysilicon wafer) from vaporized precursor compound(s). Specifically, one or more metal precursor (i.e., metal-containing precursor) compounds are vaporized and directed to one or more surfaces of a heated substrate (e.g., semiconductor substrate or substrate assembly) placed in a deposition chamber. These precursor compounds form (e.g., by reacting or decomposing) a non-volatile, thin, uniform, metal-containing layer on the surface(s) of the substrate. For the purposes of this invention, the term "vapor deposition process" is meant to include both chemical vapor deposition processes (including pulsed chemical vapor deposition processes) and atomic layer deposition processes.

"Chemical vapor deposition" (CVD) as used herein refers to a vapor deposition process wherein the desired layer is deposited on the substrate from vaporized metal precursor compounds and any reaction gases used within a deposition chamber with no effort made to separate the reaction components. In contrast to a "simple" CVD process that involves the substantial simultaneous use of the precursor compounds and any reaction gases, "pulsed" CVD alternately pulses these materials into the deposition chamber, but does not rigorously avoid intermixing of the precursor and reaction gas streams, as is typically done in atomic layer deposition or ALD (discussed in greater detail below).

"Atomic layer deposition" (ALD) as used herein refers to a vapor deposition process in which numerous consecutive deposition cycles are conducted in a deposition chamber. Typically, during each cycle the metal precursor is chemisorbed to the substrate surface; excess precursor is purged out; a subsequent precursor and/or reaction gas is introduced to react with the chemisorbed layer; and excess reaction gas (if used) and by-products are removed. As compared to the one cycle chemical vapor deposition (CVD) process, the longer duration multi-cycle ALD process allows for improved control of layer thickness by self-limiting layer growth and minimizing detrimental gas phase reactions by separation of the reaction components. The term "atomic layer deposition" as used herein is also meant to include the related terms "atomic layer epitaxy" (ALE) (see U.S. Pat. No. 5,256,244 (Ackerman)), molecular beam epitaxy (MBE), gas source MBE, organometallic MBE, and chemical beam epitaxy when performed with alternating pulses of precursor compound(s), reaction gas and purge (i.e., inert carrier) gas.

"Chemisorption" as used herein refers to the chemical adsorption of vaporized reactive precursor compounds on the surface of a substrate. The adsorbed species are irreversibly bound to the substrate surface as a result of relatively strong binding forces characterized by high adsorption energies (>30 kcal/mol), comparable in strength to ordinary chemical bonds. The chemisorbed species are limited to the formation of a monolayer on the substrate surface. (See "The Condensed Chemical Dictionary", 10th edition, revised by G. G. Hawley, published by Van Nostrand Reinhold Co., New York, 225 (1981)). The technique of ALD is based on the principle of the formation of a saturated monolayer of reactive precursor molecules by chemisorption. In ALD one or more appropriate reactive precursor compounds are alternately introduced (e.g., pulsed) into a deposition chamber and chemisorbed onto the surfaces of a substrate. Each sequential introduction of a reactive precursor compound is typically separated by an inert carrier gas purge. Each precursor compound co-reaction adds a new atomic layer to previously deposited layers to form a cumulative solid layer. The cycle is repeated, typically for several hundred times, to gradually form the desired layer thickness. It should be understood, however, that ALD can use one precursor compound and one reaction gas.

DETAILED DESCRIPTION OF PREFERRED EMBODIMENTS OF THE INVENTION

Figure 1:
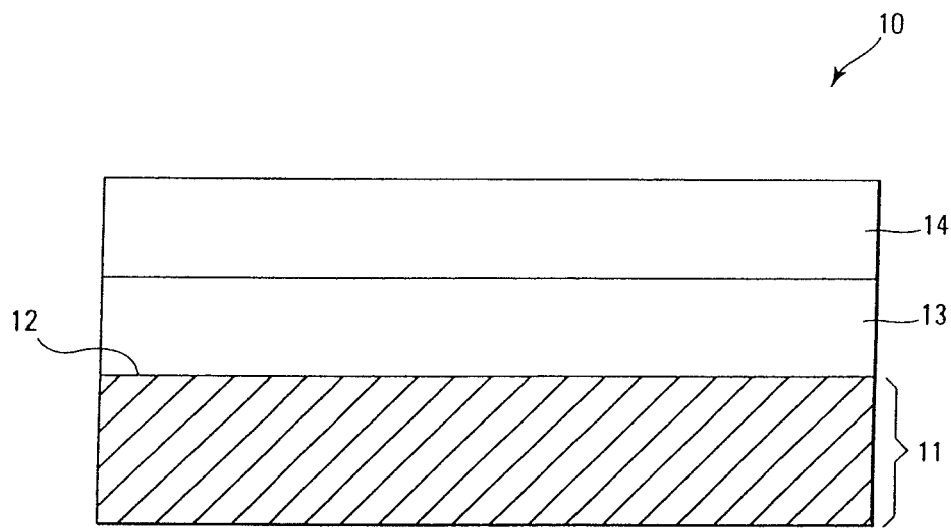
FIG. 1 shows a device structure including a tantalum silicide diffusion barrier layer according to the present invention.

The present invention provides methods of forming a tantalum-containing layer on a substrate using a vapor deposition process with one or more tantalum halide precursor compounds, one or more silicon precursor compounds, and optionally one or more nitrogen precursor compounds. For the present invention, the tantalum-containing layer is a tantalum silicide layer, preferably, a tantalum silicon nitride layer.

The layers of the present invention are preferably conductive. That is, they preferably display an electrical resistivity of no more than about 10 mΩ-cm. The layers of the present invention are typically useful as barrier layers, particularly in the manufacture of semiconductor interconnects. For example, $TaSi_2$ makes ohmic contact to silicon and is a good barrier for tungsten, aluminum, and copper interconnects. The silicide and ternary silicide-nitride are also being considered as copper barriers, but also have possible application for high dielectric constant barriers or electrodes. Other applications for the layers of the present invention include polycide gate metallization and gate electrodes. Composites containing $TaSi_2$ are also of interest as wide bandpass optical elements.

The layers or films formed can be in the form of tantalum silicide-containing films or tantalum silicon nitride-containing films, wherein the layer includes tantalum silicide (i.e., tantalum silicon) or tantalum silicon nitride optionally doped with other metals. Thus, the term "tantalum silicon (nitride)" films or layers encompass tantalum silicides (typically $TaSi_2$), tantalum silicon nitrides (typically $Ta_xSi_yN_z$ of all possible proportions of Ta, Si, and N), as well as doped films or layers thereof (e.g., mixed metal silicon (nitride)s). Such mixed metal species can be formed using one or more metal-containing precursor compounds of a formula different from Formula I, which can be readily determined by one of skill in the art.

The substrate on which the metal-containing layer is formed is preferably a semiconductor substrate or substrate assembly. Any suitable semiconductor material is contemplated, such as for example, conductively doped polysilicon (for this invention simply referred to as "silicon"). A substrate assembly may also contain a layer that includes platinum, iridium, rhodium, ruthenium, ruthenium oxide, titanium nitride, tantalum nitride, tantalum-silicon-nitride, silicon dioxide, aluminum, gallium arsenide, glass, etc., and other existing or to-be-developed materials used in semiconductor constructions, such as dynamic random access memory (DRAM) devices and static random access memory (SRAM) devices, for example. Preferred substrates include a silicon-containing surface.

Substrates other than semiconductor substrates or substrate assemblies can be used in methods of the present invention. These include, for example, fibers, wires, etc. If the substrate is a semiconductor substrate or substrate assembly, the layers can be formed directly on the lowest semiconductor surface of the substrate, or they can be formed on any of a variety of the layers (i.e., surfaces) as in a patterned wafer, for example.

Metal precursor compounds (i.e., metal-containing precursor compounds) useful in the practice of this invention are of the formula $TaY_5$ (Formula I) wherein each Y is independently a halogen atom. More preferably, each Y is a fluorine atom. For particularly preferred embodiments, the refractory metal precursor compound is a tantalum precursor compound of the formula $TaF_5$.

Silicon precursor compounds useful in the practice of this invention include silane ($SiH_4$), disilane ($Si_2H_6$), halogenated silanes (preferably chlorinated silanes of the formula $SiH_rCl_s$ wherein r=1–4 and s=4–r), and organic silanes of the formula $SiH_pR_q$ wherein p=1–4, q=4–p, and each R is independently an organic group (preferably having up to six carbon atoms, more preferably up to two carbon atoms, and most preferably, being an organic moiety). Examples include silane ($SiH_4$), disilane ($Si_2H_6$), dichlorosilane ($SiH_2Cl_2$), trichlorosilane ($SiHCl_3$), and trimethylsilane ($SiH(CH_3)_3$).

Optional nitrogen precursor compounds useful in the practice of this invention include ammonia ($NH_3$), hydrazine ($N_2H_4$), dimethyl hydrazine, as well as other nitrogen sources such as organic amines, such as those disclosed in U.S. Pat. No. 6,967,159 (Vaartstra) and the disilazanes disclosed in U.S. Pat. No. 6,794,284 (Vaartstra).

As used herein, the term "organic group" is used for the purpose of this invention to mean a hydrocarbon group that is classified as an aliphatic group, cyclic group, or combination of aliphatic and cyclic groups (e.g., alkaryl and aralkyl groups). In the context of the present invention, suitable organic groups for precursor compounds of this invention are those that do not interfere with the formation of a metal-containing layer using vapor deposition techniques. In the context of the present invention, the term "aliphatic group" means a saturated or unsaturated linear or branched hydrocarbon group. This term is used to encompass alkyl, alkenyl, and alkynyl groups, for example. The term "alkyl group" means a saturated linear or branched monovalent hydrocarbon group including, for example, methyl, ethyl, n-propyl, isopropyl, t-butyl, amyl, heptyl, 2-ethylhexyl, dodecyl, octadecyl, and the like. The term "alkenyl group" means an unsaturated, linear or branched monovalent hydrocarbon group with one or more olefinically unsaturated groups (i.e., carbon-carbon double bonds), such as a vinyl group. The term "alkynyl group" means an unsaturated, linear or branched monovalent hydrocarbon group with one or more carbon-carbon triple bonds. The term "cyclic group" means a closed ring hydrocarbon group that is classified as an alicyclic group, aromatic group, or heterocyclic group. The term "alicyclic group" means a cyclic hydrocarbon group having properties resembling those of aliphatic groups. The term "aromatic group" or "aryl group" means a mono- or polynuclear aromatic hydrocarbon group. The term "heterocyclic group" means a closed ring hydrocarbon in which one or more of the atoms in the ring is an element other than carbon (e.g., nitrogen, oxygen, sulfur, etc.).

As a means of simplifying the discussion and the recitation of certain terminology used throughout this application, the terms "group" and "moiety" are used to differentiate between chemical species that allow for substitution or that may be substituted and those that do not so allow for substitution or may not be so substituted. Thus, when the term "group" is used to describe a chemical substituent, the described chemical material includes the unsubstituted group and that group with nonperoxidic O, N, Si, F, or S atoms, for example, in the chain as well as carbonyl groups or other conventional substituents. Where the term "moiety" is used to describe a chemical compound or substituent, only an unsubstituted chemical material is intended to be included. For example, the phrase "alkyl group" is intended to include not only pure open chain saturated hydrocarbon alkyl substituents, such as methyl, ethyl, propyl, t-butyl, and the like, but also alkyl substituents bearing further substituents known in the art, such as hydroxy, alkoxy, alkylsulfonyl, halogen atoms, cyano, nitro, amino, carboxyl, etc. Thus, "alkyl group" includes ether groups, haloalkyls, nitroalkyls, carboxyalkyls, hydroxyalkyls, sulfoalkyls, etc. On the other hand, the phrase "alkyl moiety" is limited to the inclusion of only pure open chain saturated hydrocarbon alkyl substituents, such as methyl, ethyl, propyl, t-butyl, and the like.

Various precursor compounds can be used in various combinations, optionally with one or more organic solvents (particularly for CVD processes), to form a precursor composition. The precursor compounds may be liquids or solids at room temperature (preferably, they are liquids at the vaporization temperature). Typically, they are liquids sufficiently volatile to be employed using known vapor deposition techniques. However, as solids they may also be sufficiently volatile that they can be vaporized or sublimed from the solid state using known vapor deposition techniques. If they are less volatile solids, they are preferably sufficiently soluble in an organic solvent or have melting points below their decomposition temperatures such that they can be used in flash vaporization, bubbling, microdroplet formation techniques, etc. Herein, vaporized precursor compounds may be used either alone or optionally with vaporized molecules of other precursor compounds or optionally with vaporized solvent molecules, if used. As used herein, "liquid" refers to a solution or a neat liquid (a liquid at room temperature or a solid at room temperature that melts at an elevated temperature). As used herein, "solution" does not require complete solubility of the solid but may allow for some undissolved solid, as long as there is a sufficient amount of the solid delivered by the organic solvent into the vapor phase for chemical vapor deposition processing. If solvent dilution is used in deposition, the total molar concentration of solvent vapor generated may also be considered as a inert carrier gas.

The solvents that are suitable for this application (particularly for a CVD process) can be one or more of the following: aliphatic hydrocarbons or unsaturated hydrocarbons (C3-C20, and preferably C5-C10, cyclic, branched, or linear), aromatic hydrocarbons (C5-C20, and preferably C5-C10), halogenated hydrocarbons, silylated hydrocarbons such as alkylsilanes, alkylsilicates, ethers, polyethers, thioethers, esters, lactones, ammonia, amides, amines (aliphatic or aromatic, primary, secondary, or tertiary), polyamines, nitriles, cyanates, isocyanates, thiocyanates, silicone oils, alcohols, or compounds containing combinations of any of the above or mixtures of one or more of the above. The compounds are also generally compatible with each other, so that mixtures of variable quantities of the precursor compounds will not interact to significantly change their physical properties.

The precursor compounds can be vaporized in the presence of an inert carrier gas if desired. Additionally, an inert carrier gas can be used in purging steps in an ALD process. The inert carrier gas is typically selected from the group consisting of nitrogen, helium, argon, and mixtures thereof. In the context of the present invention, an inert carrier gas is one that is generally unreactive with the complexes described herein and does not interfere with the formation of the desired metal-containing film (i.e., layer).

The deposition process for this invention is a vapor deposition process. Vapor deposition processes are generally favored in the semiconductor industry due to the process capability to quickly provide highly conformal layers even within deep contacts and other openings. Chemical vapor deposition (CVD) and atomic layer deposition (ALD) are two vapor deposition processes often employed to form thin, continuous, uniform, metal-containing (preferably, barrier) layers onto semiconductor substrates. Using either vapor deposition process, typically one or more precursor compounds are vaporized in a deposition chamber to form a metal-containing layer on a substrate. It will be readily apparent to one skilled in the art that the vapor deposition process may be enhanced by employing various related techniques such as plasma assistance, photo assistance, laser assistance, as well as other techniques.

The final layer (preferably, a dielectric layer) formed preferably has a thickness in the range of about 10 Å to about 500 Å. More preferably, the thickness of the metal-containing layer is in the range of about 30 Å to about 80 Å.

Chemical vapor deposition (CVD) has been extensively used for the preparation of metal-containing layers, such as dielectric layers, in semiconductor processing because of its ability to provide highly conformal and high quality dielectric layers at relatively fast processing times. The desired precursor compounds are vaporized and then introduced into a deposition chamber containing a heated substrate with optional inert carrier gases. In a typical CVD process, vaporized precursors are contacted at the substrate surface to form a layer (e.g., barrier layer). The single deposition cycle is allowed to continue until the desired thickness of the layer is achieved.

Typical CVD processes generally employ precursor compounds in vaporization chambers that are separated from the process chamber wherein the deposition surface or wafer is located. For example, liquid precursor compounds are typically placed in bubblers and heated to a temperature at which they vaporize, and the vaporized liquid precursor compound is then transported by an inert carrier gas passing over the bubbler or through the liquid precursor compound. The vapors are then swept through a gas line to the deposition chamber for depositing a layer on substrate surface(s) therein. Many techniques have been developed to precisely control this process. For example, the amount of precursor material transported to the deposition chamber can be precisely controlled by the temperature of the reservoir containing the precursor compounds and by the flow of an inert carrier gas bubbled through or passed over the reservoir.

Preferred embodiments of the precursor compounds described herein are particularly suitable for chemical vapor deposition (CVD). The deposition temperature at the substrate surface is preferably held at a temperature in a range of about 100° C. to about 600° C., more preferably in the range of about 200° C. to about 500° C. The deposition chamber pressure is preferably maintained at a deposition pressure of about 0.1 torr to about 10 torr. The partial pressure of precursor compounds in the inert carrier gas is preferably about 0.001 torr to about 10 torr.

Several modifications of the CVD process and chambers are possible, for example, using atmospheric pressure chemical vapor deposition, low pressure chemical vapor deposition (LPCVD), plasma enhanced chemical vapor deposition (PECVD), hot wall or cold wall reactors or any other chemical vapor deposition technique. Furthermore, pulsed CVD can be used, which is similar to ALD (discussed in greater detail below) but does not rigorously avoid intermixing of precursor streams. Also, for pulsed CVD, the deposition thickness is dependent on the exposure time, as opposed to ALD, which is self-limiting (discussed in greater detail below).

A typical CVD process may be carried out in a chemical vapor deposition reactor, such as a deposition chamber available under the trade designation of 7000 from Genus, Inc. (Sunnyvale, Calif.), a deposition chamber available under the trade designation of 5000 from Applied Materials, Inc. (Santa Clara, Calif.), or a deposition chamber available under the trade designation of Prism from Novelus, Inc. (San Jose, Calif.). However, any deposition chamber suitable for performing CVD may be used.

Alternatively, and preferably, the vapor deposition process employed is a multi-cycle ALD process. Typically, this process provides for optimum control of atomic-level thickness and uniformity to the deposited layer (e.g., barrier layer) and to expose the metal precursor compounds to lower volatilization and reaction temperatures to minimize degradation. Typically, in an ALD process, each reactant is pulsed sequentially onto a suitable substrate, typically at deposition temperatures of about 25° C. to about 400° C. (preferably about 150° C. to about 300° C.), which is generally lower than presently used in CVD processes. Under such conditions the film growth is typically self-limiting (i.e., when the reactive sites on a surface are used up in an ALD process, the deposition generally stops), insuring not only excellent conformality but also good large area uniformity plus simple and accurate thickness control. Due to alternate dosing of the precursor compounds, detrimental vapor-phase reactions are inherently eliminated, in contrast to the CVD process that is carried out by continuous coreaction of the precursors. (See Vehkamäki et al, "Growth of $SrTiO_3$ and $BaTiO_3$ Thin Films by Atomic Layer Deposition," Electrochemical and Solid-State Letters, 2(10):504-506 (1999)).

A typical ALD process includes exposing an initial substrate to a first chemical species (e.g., refractory metal precursor compound of the formula $MY_n$) to accomplish chemisorption of the species onto the substrate. Theoretically, the chemisorption forms a monolayer that is uniformly one atom or molecule thick on the entire exposed initial substrate. In other words, a saturated monolayer. Practically, chemisorption might not occur on all portions of the substrate. Nevertheless, such an imperfect monolayer is still a monolayer in the context of the present invention. In many applications, merely a substantially saturated monolayer may be suitable. A substantially saturated monolayer is one that will still yield a deposited layer exhibiting the quality and/or properties desired for such layer.

The first species is purged from over the substrate and a second chemical species (e.g., a different compound of the formula $TaY_5$, a metal-containing precursor compound of a formula different than $TaY_5$, or a silicon precursor compound) is provided to react with the first monolayer of the first species. The second species is then purged and the steps are repeated with exposure of the second species monolayer to the first species. In some cases, the two monolayers may be of the same species. As an option, the second species can react with the first species, but not chemisorb additional material thereto. That is, the second species can cleave some portion of the chemisorbed first species, altering such monolayer without forming another monolayer thereon. Also, a third species or more may be successively chemisorbed (or reacted) and purged just as described for the first and second species.

Purging may involve a variety of techniques including, but not limited to, contacting the substrate and/or monolayer with a carrier gas and/or lowering pressure to below the deposition pressure to reduce the concentration of a species contacting the substrate and/or chemisorbed species. Examples of carrier gases include $N_2$, Ar, He, etc. Purging may instead include contacting the substrate and/or monolayer with any substance that allows chemisorption by-products to desorb and reduces the concentration of a contacting species preparatory to introducing another species. The contacting species may be reduced to some suitable concentration or partial pressure known to those skilled in the art based on the specifications for the product of a particular deposition process.

ALD is often described as a self-limiting process, in that a finite number of sites exist on a substrate to which the first species may form chemical bonds. The second species might only bond to the first species and thus may also be self-limiting. Once all of the finite number of sites on a substrate are bonded with a first species, the first species will often not bond to other of the first species already bonded with the substrate. However, process conditions can be varied in ALD to promote such bonding and render ALD not self-limiting. Accordingly, ALD may also encompass a species forming other than one monolayer at a time by stacking of a species, forming a layer more than one atom or molecule thick.

The described method indicates the "substantial absence" of the second precursor (i.e., second species) during chemisorption of the first precursor since insignificant amounts of the second precursor might be present. According to the knowledge and the preferences of those with ordinary skill in the art, a determination can be made as to the tolerable amount of second precursor and process conditions selected to achieve the substantial absence of the second precursor.

Thus, during the ALD process, numerous consecutive deposition cycles are conducted in the deposition chamber, each cycle depositing a very thin metal-containing layer (usually less than one monolayer such that the growth rate on average is from about 0.2 to about 3.0 Angstroms per cycle), until a layer of the desired thickness is built up on the substrate of interest. The layer deposition is accomplished by alternately introducing (i.e., by pulsing) refractory metal precursor compound(s) and silicon precursor compound(s) into the deposition chamber containing a semiconductor substrate, chemisorbing the precursor compound(s) as a monolayer onto the substrate surfaces, and then reacting the chemisorbed precursor compound(s) with the other co-reactive precursor compound(s). The pulse duration of precursor compound(s) and inert carrier gas(es) is sufficient to saturate the substrate surface. Typically, the pulse duration is from about 0.1 to about 5 seconds, preferably from about 0.2 to about 1 second.

In comparison to the predominantly thermally driven CVD, ALD is predominantly chemically driven. Accordingly, ALD is often conducted at much lower temperatures than CVD. During the ALD process, the substrate temperature is maintained at a temperature sufficiently low to maintain intact bonds between the chemisorbed precursor compound(s) and the underlying substrate surface and to prevent decomposition of the precursor compound(s). The temperature is also sufficiently high to avoid condensation of the precursor compounds(s). Typically the substrate temperature is kept within the range of about 25° C. to about 400° C. (preferably about 150° C. to about 300° C.), which is generally lower than presently used in CVD processes. Thus, the first species or precursor compound is chemisorbed at this temperature. Surface reaction of the second species or precursor compound can occur at substantially the same temperature as chemisorption of the first precursor or, less preferably, at a substantially different temperature. Clearly, some small variation in temperature, as judged by those of ordinary skill, can occur but still be a substantially same temperature by providing a reaction rate statistically the same as would occur at the temperature of the first precursor chemisorption. Chemisorption and subsequent reactions could instead occur at exactly the same temperature.

For a typical ALD process, the pressure inside the deposition chamber is kept at about $10^{-4}$ torr to about 1 torr, preferably about $10^{-4}$ torr to about 0.1 torr. Typically, the deposition chamber is purged with an inert carrier gas after the vaporized precursor compound(s) have been introduced into the chamber and/or reacted for each cycle. The inert carrier gas(es) can also be introduced with the vaporized precursor compound(s) during each cycle.

The reactivity of a precursor compound can significantly influence the process parameters in ALD. Under typical CVD process conditions, a highly reactive compound may react in the gas phase generating particulates, depositing prematurely on undesired surfaces, producing poor films, and/or yielding poor step coverage or otherwise yielding non-uniform deposition. For at least such reason, a highly reactive compound might be considered not suitable for CVD. However, some compounds not suitable for CVD are superior ALD precursors. For example, if the first precursor is gas phase reactive with the second precursor, such a combination of compounds might not be suitable for CVD, although they could be used in ALD. In the CVD context, concern might also exist regarding sticking coefficients and surface mobility, as known to those skilled in the art, when using highly gas-phase reactive precursors, however, little or no such concern would exist in the ALD context.

As stated above, the use of the complexes and methods of forming films of the present invention are beneficial for a wide variety of thin film applications in semiconductor structures. For example, such applications include capacitors such as planar cells, trench cells (e.g., double sidewall trench capacitors), stacked cells (e.g., crown, V-cell, delta cell, multi-fingered, or cylindrical container stacked capacitors), as well as field effect transistor devices.

Figure 2:
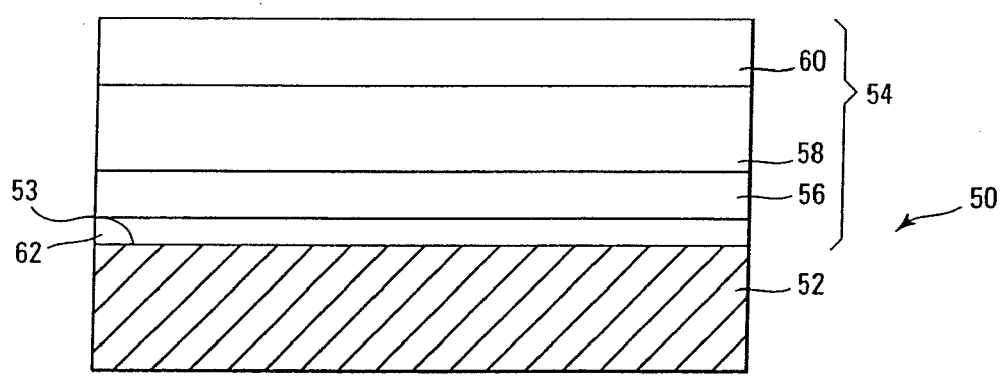
FIG. 2 is a structure showing a high dielectric capacitor including an electrode having a tantalum silicide diffusion barrier layer according to the present invention.

Use of the barrier layers of the present invention in semiconductor constructions shall be described generally with reference to FIGS. 1 and 2.

FIG. 1 illustrates a structure 10 including a substrate assembly 11 and a tantalum silicide (preferably, a tantalum silicon nitride) diffusion barrier layer 13 according to the present invention formed on a surface 12 of the substrate assembly 11, e.g., a silicon containing surface. The structure 10 further includes a conductive layer 14 (e.g., a copper layer). The structure 10 is illustrative of the use of a tantalum silicide diffusion barrier layer for any application requiring an effective barrier layer, for example, to prevent diffusion from a silicon containing surface. In other words, the tantalum silicide (preferably, a tantalum silicon nitride) diffusion barrier layer 13 may be used in the fabrication of semiconductor devices wherever it is necessary to prevent the diffusion of one material to an adjacent material. For example, the substrate assembly 11 may be representative of a contact structure having an opening extending to a silicon containing surface. In such a structure, diffusion barriers are commonly used in such openings to prevent undesirable reactions, such as the reaction of a conductive contact material, e.g, copper or aluminum, with the silicon containing surface.

Further, for example, the tantalum silicide diffusion barrier layer 13 may be used in the formation of storage cell capacitors for use in semiconductor devices, e.g., memory devices. As further described herein, the tantalum silicide diffusion barrier layer is used within a stack of layers forming an electrode of a capacitor, e.g., the other layers including layers formed of materials such as platinum, ruthenium oxide, etc. One skilled in the art will recognize that various semiconductor processes and structures for various devices, e.g., CMOS devices, memory devices, etc., would benefit from the barrier characteristics of the barrier layers of the present invention and in no manner is the present invention limited to the illustrative embodiments described herein.

FIG. 2 shows a structure 50 including substrate assembly 52 (e.g., a silicon substrate) and capacitor structure 54 formed relative thereto. Capacitor structure 54 includes a first electrode 56, a second electrode 60, and a high dielectric constant layer 58 interposed therebetween. For example, the dielectric layer may be any suitable material having a desirable dielectric constant, such as $TiO_2$, $ZrO_2$, $HfO_2$, $Ta_2O_5$, $(Ba,Sr)TiO_3$, $Pb(Zr,Ti)O_3$, or $SrBi_2Ti_2O_9$. With use of the high dielectric constant layer 58, diffusion barrier properties of the electrodes is particularly important. For example, to function well in a bottom electrode of a capacitor structure, the electrode layer or electrode stack must act as an effective barrier to the diffusion of silicon, particularly due to the processes used to form the high dielectric constant materials. Such diffusion barrier properties are required when the substrate assembly 52 includes a silicon-containing surface 53 upon which the capacitor is formed, e.g., polysilicon, silicon substrate material, N-doped silicon, P-doped silicon, etc., since oxidation of the diffused silicon to form silicon dioxide may result in degraded capacitance, e.g., capacitance for a memory device. In addition, the electrode stack must act as an oxygen barrier (e.g., diffusion barrier layer 62) to protect the silicon-containing surface under the stack from oxidizing. The formation of the tantalum silicide (preferably, tantalum silicon nitride) diffusion barrier layer enhances the barrier properties of the stack.

Figure 3:
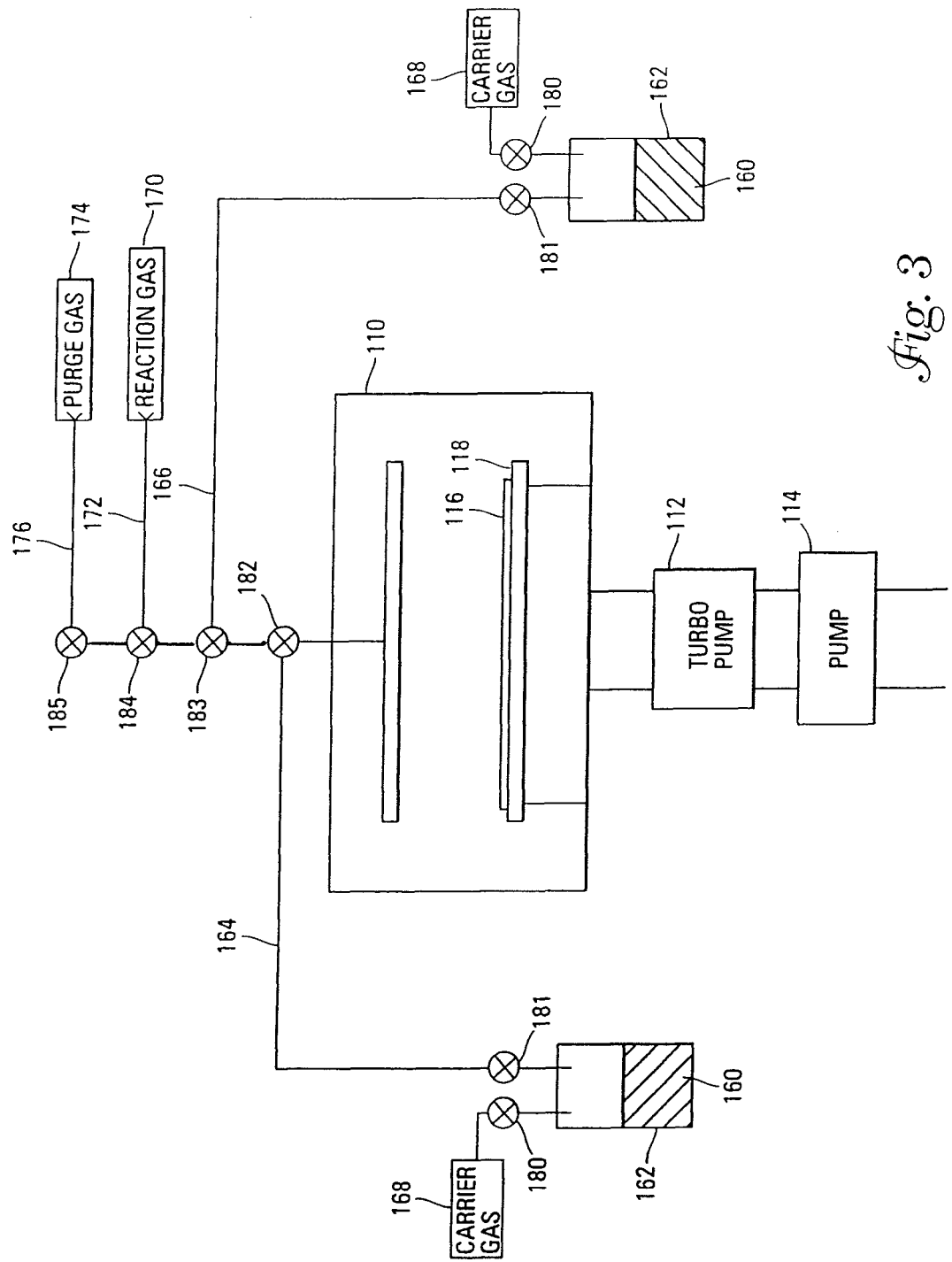
FIG. 3 is a perspective view of a vapor deposition coating system suitable for use in the method of the present invention.

A system that can be used to perform vapor deposition processes (chemical vapor deposition or atomic layer deposition) of the present invention is shown in FIG. 3. The system includes an enclosed vapor deposition chamber 110, in which a vacuum may be created using turbo pump 112 and backing pump 114. One or more substrates 116 (e.g., semiconductor substrates or substrate assemblies) are positioned in chamber 110. A constant nominal temperature is established for substrate 116, which can vary depending on the process used. Substrate 116 may be heated, for example, by an electrical resistance heater 118 on which substrate 116 is mounted. Other known methods of heating the substrate may also be utilized.

In this process, precursor compounds 160 (e.g., a tantalum precursor compound and a silicon precursor compound) are stored in vessels 162. The precursor compounds are vaporized and separately fed along lines 164 and 166 to the deposition chamber 110 using, for example, an inert carrier gas 168. A reaction gas 170 (although for the present invention, reaction gases are not necessary or desirable) may be supplied along line 172 as needed. Also, a purge gas 174, which is often the same as the inert carrier gas 168, may be supplied along line 176 as needed. As shown, a series of valves 180-185 are opened and closed as required.

The following examples are offered to further illustrate the various specific and preferred embodiments and techniques. It should be understood, however, that many variations and modifications may be made while remaining within the scope of the present invention, so the scope of the invention is not intended to be limited by the examples.

EXAMPLE

Example 1

Pulsed Chemical Vapor Deposition of Tantalum Silicide

Using a pulsed CVD method, the following precursor compounds were pulsed for 200 cycles in a deposition chamber as described in FIG. 3 containing a borophosphosilicate glass (BPSG) substrate, each cycle consisting of pulses in the following order: (1) tantalum pentafluoride (Alfa Aesar, Ward Hill, Mass.; and (2) disilane (VOC Gases). During each cycle, excess amounts of each precursor compound not chemisorbed were purged from the chamber after chemisorption and prior to the introduction of the next precursor compound using an argon sweep at 30 mL/min and a vacuum pump. The substrate temperature was kept at approximately 275° C. throughout the entire deposition process.

At the end of the process, a 1700 Å thick mirror-like layer of tantalum silicide was formed having a resistivity of 255 μΩ-cm. The layer contained tantalum, silicon, and a trace of oxygen as determined by x-ray photoelectron spectroscopy (XPS) analysis. X-ray diffraction analysis (XRD) showed the layer to be crystalline $TaSi_2$, as measured immediately after the process was completed.

The complete disclosures of the patents, patent documents, and publications cited herein are incorporated by reference in their entirety as if each were individually incorporated. Various modifications and alterations to this invention will become apparent to those skilled in the art without departing from the scope and spirit of this invention. It should be understood that this invention is not intended to be unduly limited by the illustrative embodiments and examples set forth herein and that such examples and embodiments are presented by way of example only with the scope of the invention intended to be limited only by the claims set forth herein as follows.

What is claimed is:

1. A method of forming a layer on a substrate comprising:
    directing a vapor comprising one or more tantalum precursor compounds directly onto one or more silicon-containing surfaces of a substrate, wherein the one or more tantalum precursor compounds are of the formula $TaY_5$ (Formula I), wherein each Y is independently a halogen atom;
    allowing the vapor comprising the one or more tantalum precursor compounds to chemisorb directly onto the one or more silicon-containing surfaces of the substrate; and
    directing a vapor comprising one or more silicon precursor compounds to the one or more silicon-containing surfaces of the substrate to form a tantalum silicide layer on the one or more silicon-containing surfaces of the substrate,
    wherein directing the vapors is accomplished using an atomic layer deposition process comprising a plurality of deposition cycles, with the proviso that the method does not include providing a vapor comprising one or more nitrogen precursor compounds.

2. The method of claim 1 wherein each Y is a fluorine atom.

3. The method of claim 1 wherein at least one of the one or more silicon precursor compounds is silane or disilane.

4. The method of claim 1 wherein at least one of the one or more silicon precursor compounds is a halogenated silane or an organic silane.

5. The method of claim 1 wherein the tantalum silicide layer is a diffusion barrier layer.

6. The method of claim 1 wherein each deposition cycle comprises alternately directing the one or more vaporized tantalum precursor compounds and the one or more vaporized silicon precursor compounds.

7. A method of forming a layer on a substrate comprising:
    providing a vapor comprising one or more tantalum precursor compounds of the formula $TaY_5$ (Formula I), wherein each Y is independently a halogen atom;
    providing a vapor comprising one or more silicon precursor compounds, wherein at least one of the one or more silicon precursor compounds is an organic silane of the formula $SiH_pR_q$ wherein p=1-4, q=4−p, and each R is independently an organic group, with the proviso that the one or more silicon precursor compounds do not comprise silane ($SiH_4$); and
    directing the vapors comprising the one or more tantalum precursor compounds and the one or more silicon precursor compounds to a substrate comprising one or more silicon-containing surfaces to form a tantalum silicide layer on the one or more silicon-containing surfaces of the substrate,
    wherein the vapor comprising the one or more precursor compounds of the Formula I is directed to the substrate and allowed to chemisorb directly on the one or more silicon-containing surfaces, with the proviso that the method does not include providing a vapor comprising one or more nitrogen precursor compounds.

8. The method of claim 7 wherein each Y is a fluorine atom.

9. The method of claim 7 wherein the tantalum silicide layer is a diffusion barrier layer.

10. A method of forming a layer on a substrate comprising:
    providing a vapor comprising one or more tantalum precursor compounds of the formula $TaY_5$ (Formula I), wherein each Y is independently a halogen atom;
    providing a vapor comprising one or more silicon precursor compounds; and
    directing the vapors comprising the one or more tantalum precursor compounds and the one or more silicon precursor compounds to a substrate comprising one or more silicon-containing surfaces to form a tantalum silicide layer on one or more surfaces of the substrate,
    wherein the vapor comprising the one or more precursor compounds of the Formula I is directed to the substrate and allowed to chemisorb directly on the silicon-containing surface, with the proviso that the method does not include providing a vapor comprising one or more nitrogen precursor compounds.

11. The method of claim 10 wherein each Y is a fluorine atom.

12. The method of claim 10 wherein at least one of the one or more silicon precursor compounds is silane or disilane.

13. The method of claim 10 wherein at least one of the one or more silicon precursor compounds is a halogenated silane or an organic silane.

14. The method of claim 10 wherein the tantalum silicide layer is a diffusion barrier layer.

* * * * *

UNITED STATES PATENT AND TRADEMARK OFFICE
CERTIFICATE OF CORRECTION

| | | |
|---|---|---|
| PATENT NO. | : 7,943,501 B2 | Page 1 of 1 |
| APPLICATION NO. | : 11/969182 | |
| DATED | : May 17, 2011 | |
| INVENTOR(S) | : Brian A. Vaartstra | |

It is certified that error appears in the above-identified patent and that said Letters Patent is hereby corrected as shown below:

In column 1, line 5, delete "(pending)," and insert -- now abandoned, --, therefor.

Signed and Sealed this
Twelfth Day of July, 2011

David J. Kappos
*Director of the United States Patent and Trademark Office*